United States Patent

Kobayakawa

(10) Patent No.: US 9,876,150 B2
(45) Date of Patent: Jan. 23, 2018

(54) METHOD FOR PRODUCING OPTICAL SEMICONDUCTOR DEVICE AND OPTICAL SEMICONDUCTOR DEVICE

(71) Applicant: ROHM CO., LTD., Kyoto-shi, Kyoto (JP)

(72) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/270,843

(22) Filed: Sep. 20, 2016

(65) Prior Publication Data

US 2017/0104137 A1  Apr. 13, 2017

(30) Foreign Application Priority Data

Oct. 13, 2015 (JP) ................. 2015-201816

(51) Int. Cl.
  *H01L 33/00* (2010.01)
  *H01L 33/56* (2010.01)
  *H01L 33/58* (2010.01)
  *H01L 33/62* (2010.01)

(52) U.S. Cl.
  CPC .......... *H01L 33/56* (2013.01); *H01L 33/0095* (2013.01); *H01L 33/58* (2013.01); *H01L 33/62* (2013.01); *H01L 2224/48227* (2013.01); *H01L 2224/48465* (2013.01); *H01L 2224/73265* (2013.01); *H01L 2224/97* (2013.01); *H01L 2924/181* (2013.01); *H01L 2933/005* (2013.01); *H01L 2933/0033* (2013.01); *H01L 2933/0066* (2013.01)

(58) Field of Classification Search
  CPC ..... H01L 33/56; H01L 33/0095; H01L 33/58; H01L 33/62; H01L 2933/0033; H01L 2933/005; H01L 2933/0066

USPC .......................................................... 257/98
See application file for complete search history.

(56) References Cited

U.S. PATENT DOCUMENTS

| 2005/0122031 A1* | 6/2005 | Itai ................... H01L 33/486 313/498 |
| 2007/0241357 A1* | 10/2007 | Yan ................... H01L 33/486 257/98 |
| 2016/0058311 A1* | 3/2016 | Kondo ............... A61B 5/02427 600/479 |

FOREIGN PATENT DOCUMENTS

JP  2014-209617 A  11/2014

* cited by examiner

*Primary Examiner* — Tu-Tu Ho
(74) *Attorney, Agent, or Firm* — Hamre, Schumann, Mueller & Larson, P.C.

(57) ABSTRACT

A method is provided for making optical semiconductor devices collectively. LED chips are arranged on a material substrate, and the substrate is sandwiched by a common mold and a first cooperating mold formed with a cavity. A light-transmitting resin is injected into the cavity and solidified to form a light-transmitting resin member including body portions for sealing the LED chips and connecting portions each connecting adjacent body portions. Then, the substrate is sandwiched by the common mold and a second cooperating mold formed with another cavity. A light-shielding resin is injected into the cavity and solidified to form a light-shielding resin member filling the gaps between the body portions. The body portions are separated from each other by making cuts in the material substrate and the light-shielding resin member.

23 Claims, 15 Drawing Sheets

METHOD FOR PRODUCING OPTICAL SEMICONDUCTOR DEVICE AND OPTICAL SEMICONDUCTOR DEVICE

BACKGROUND OF THE INVENTION

1. Field of the Invention

The present invention in general relates to an optical semiconductor device and more particularly to a method for making optical semiconductor devices.

2. Description of Related Art

JP 2014-209617A discloses an example of a conventional optical semiconductor device. The optical semiconductor device disclosed in the document includes an LED chip sealed in a light-transmitting resin, and a light-shielding resin frame that surrounds the light-transmitting resin and accommodates the LED chip.

With the above conventional semiconductor device, the LED chip may be accommodated into the light-shielding resin frame by using a bonding tool. There is concern, however, that the frame and the bonding tool may interfere with each other in the chip bonding operation. Further, a capillary for bonding a wire to the LED chip may also interfere with the light-shielding resin frame. Such problems become more critical for a smaller optical semiconductor device.

SUMMARY OF THE INVENTION

The present invention has been proposed under the above-described circumstances. It is therefore an object of the invention to provide an optical semiconductor device production method whereby an appropriately small optical semiconductor device can be produced without suffering the above-noted problems. Another object of the invention is to provide such an optical semiconductor device.

According to a first aspect of the invention, there is provided a method for producing an optical semiconductor device. By the method, the following steps are performed. LED chips are mounted on the obverse surface of a material substrate. The material substrate has a reverse surface opposite to the obverse surface. The material substrate is sandwiched by a common mold facing the reverse surface of the substrate and a first cooperating mold facing the obverse surface of the substrate. A light-transmitting resin is injected into the first cavity formed in the first cooperating mold. The injected light-transmitting resin is solidified to form a light-transmitting resin member including body portions and connecting portions, where each of the body portions seals one of the LED chips, and each of the connecting portions connects two adjacent body portions of the body portions. The material substrate is sandwiched by the common mold and a second cooperating mold facing the obverse surface of the substrate. A light-shielding resin is injected into the second cavity formed in the second cooperating mold. The injected light-shielding resin is solidified to form a light-shielding resin member filling gaps between the body portions. The body portions, which are interconnected at this stage, are then separated from each other by making cuts at least in the material substrate and the light-shielding resin member.

According to a second aspect of the invention, there is provided an optical semiconductor device that includes: a substrate made up of a base and a wiring pattern, where the base includes an obverse surface and a reverse surface spaced apart from each other in a thickness direction; an LED chip mounted on the obverse surface of the base; a light-transmitting resin member covering the LED chip; and a light-shielding resin member covering a part of the light-transmitting resin member. The light-transmitting resin member includes a body portion covering the LED chip, and an extending portion extending from the body portion in a first direction perpendicular to the thickness direction of the base. The light-shielding resin member covers at least a part of the extending portion.

According to the above method of the invention, a body portion of light-transmitting resin is formed to cover a corresponding one LED chip (which is pre-mounted on a substrate), and then a light-shielding resin member (corresponding to the conventional frame) is formed to cover a part of the body portion. In this manner, there is no interference to occur between the mounting operation of the LED chip and the presence of the light-shielding resin member. Accordingly, the distance between the light-shielding resin and the LED chip can be reduced further than is conventionally possible, which contributes to producing a compact optical semiconductor device.

Other features and advantages of the present invention will become more apparent from the detailed description given below with reference to the accompanying drawings.

DETAILED DESCRIPTION OF THE PREFERRED EMBODIMENTS

Preferred embodiments of the present invention will be described below with reference to the accompanying drawings.

A method for producing an optical semiconductor device according to a first embodiment of the present invention will be described with reference to FIGS. 1 to 9.

Figure 1:
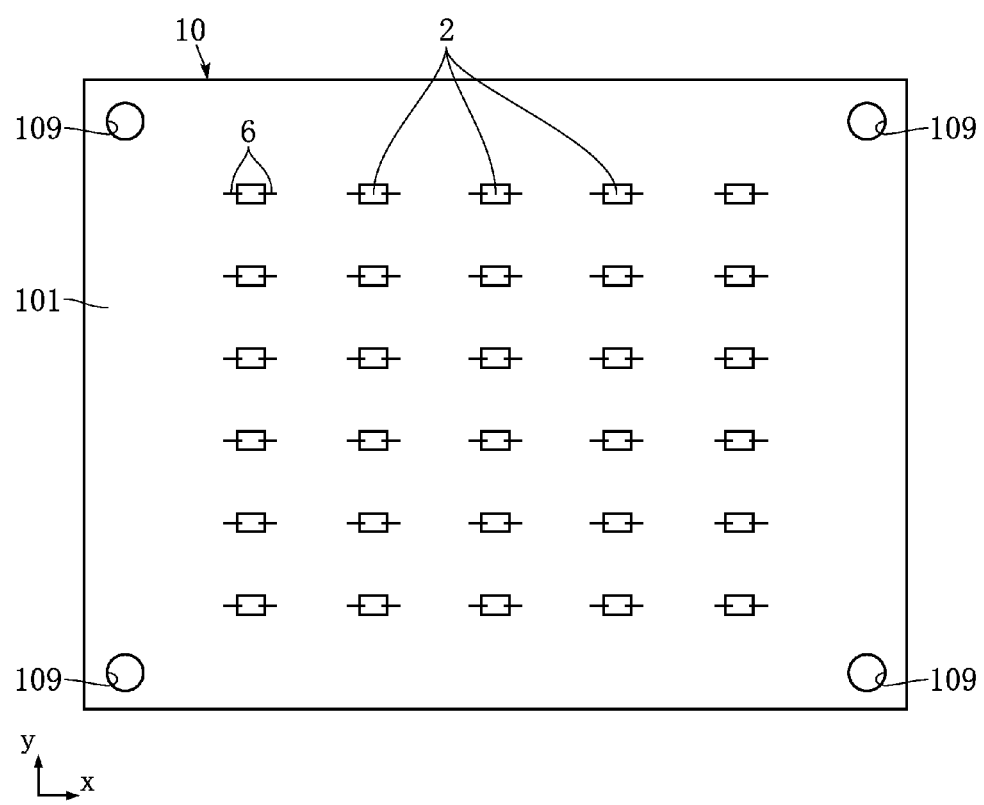
FIG. 1 is a plan view showing a step of mounting LED chips in a method for producing an optical semiconductor device according to a first embodiment of the present invention.

First, as shown in FIG. 1, a material substrate 10 is prepared. As described later, the material substrate 10 includes a base made of an insulating material and a wiring pattern formed on the base. For the sake of convenience, the base and the wiring pattern are shown in FIGS. 1 to 9 without making distinction therebetween. The material substrate 10 includes an obverse surface 101 and a reverse surface 102 that face opposite to each other.

Then, a predetermined number of LED chips 2 are mounted on the obverse surface 101 of the material substrate 10. The LED chips 2 are mounted, for example, by being bonded to the wiring pattern of the substrate 10 via a bonding material. In the present embodiment, the LED chips 2 are arranged on the obverse surface 101 in a matrix configuration along the x-direction and the y-direction. Each LED chip 2 is connected to the wiring pattern of the substrate 10 by two wires 6. The material substrate 10 includes four substrate positioning portions 109. In the illustrated example, the substrate positioning portions 109 are penetration holes.

Figure 2:
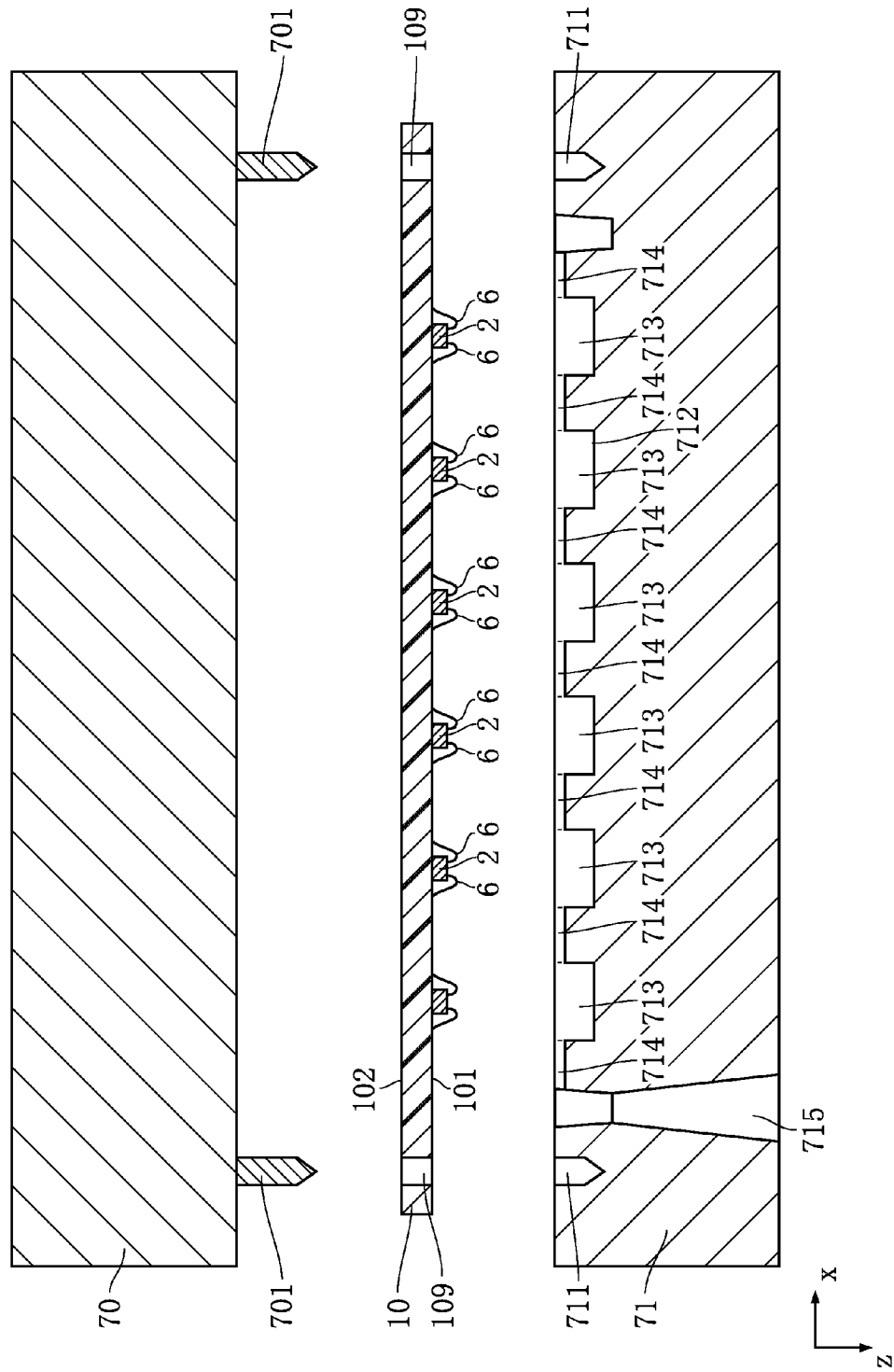
FIG. 2 is a cross-sectional view showing a material substrate, a common mold, and a first cooperating mold (light-transmitting resin mold) used in the method for producing an optical semiconductor device according to the first embodiment of the present invention.

Then, as shown in FIG. 2, use is made of a common mold 70 and a first cooperating mold 71 for light-transmitting resin ("light-transmitting resin mold"). The common mold 70 includes four common-side positioning portions 701. The common-side positioning portions 701 serve to position the common mold 70 and the material substrate 10, and the light-transmitting resin mold 71 relative to each other. In the present embodiment, the common-side positioning portions 701 each have a shape that protrudes downward in the z-direction in FIG. 2, and may be pins made of a metal. The common mold 70 is disposed on the reverse surface 102 side of the material substrate 10.

The light-transmitting resin mold 71 includes four light-transmitting resin-side positioning portions 711, a cavity 712 for shaping a light-transmitting resin ("light-transmitting resin cavity"), and an injection hole 715. The light-transmitting resin-side positioning portions 711 serve to position the light-transmitting resin mold 71 relative to the common mold 70 and the material substrate 10. In the present embodiment, the light-transmitting resin-side positioning portions 711 are recessed portions into which the common-side positioning portions 701 of the common mold 70 are fitted. The light-transmitting resin mold 71 is disposed on the obverse surface 101 side of the material substrate 10.

The light-transmitting resin cavity 712 includes a plurality of body molding portions 713 and a plurality of connection molding portions 714. The body molding portions 713 are portions in which the LED chips 2 are accommodated in the subsequent steps, and in the present embodiment, are arranged in a matrix configuration along the x-direction and the y-direction. The connection molding portions 714 connect the body molding portions 713 that are adjacent in the x-direction. The cross-sectional area, perpendicular to the x-direction, of each of the connection molding portions 714 is smaller than the cross-sectional area, perpendicular to the x-direction, of each of the body molding portions 713. The injection hole 715 is a hole for injecting a resin in the subsequent steps, and is in communication with the light-transmitting resin cavity 712.

Figure 3:
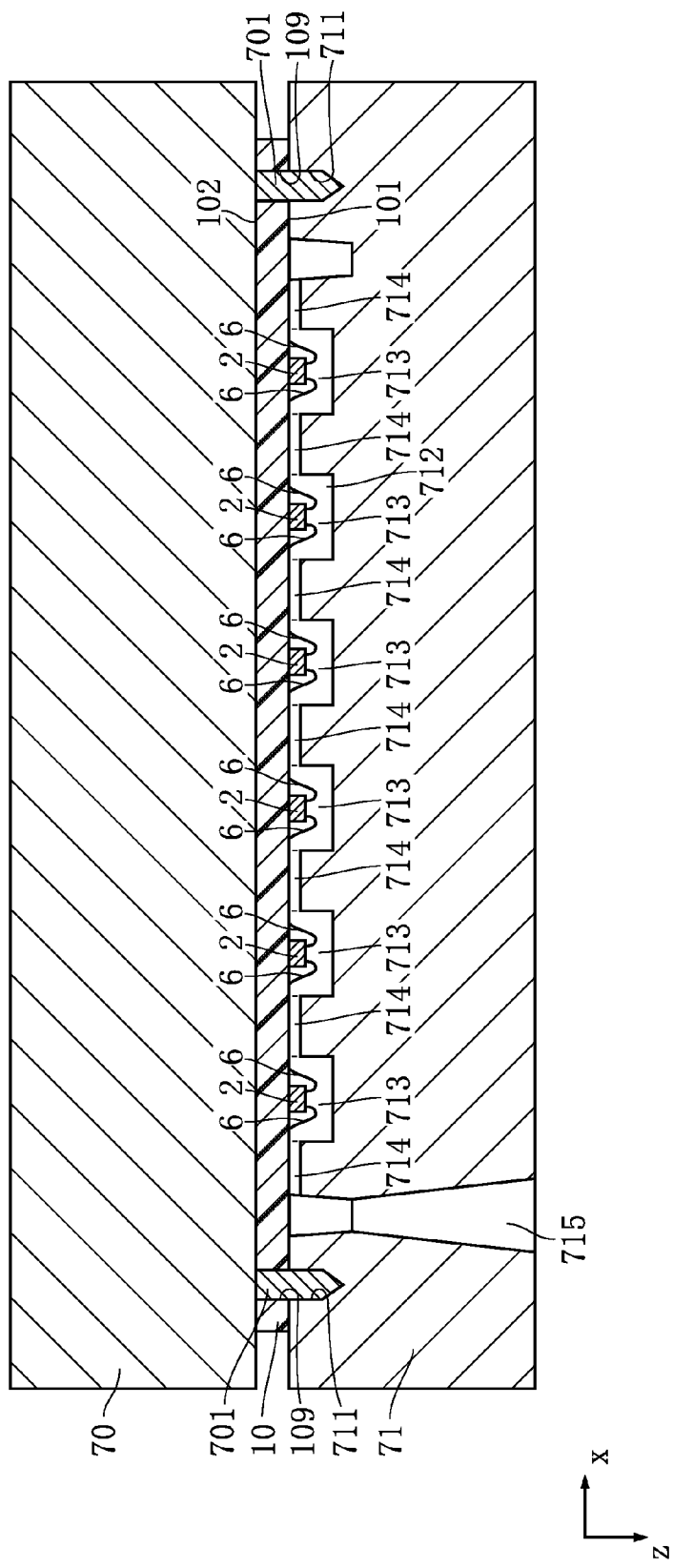
FIG. 3 is a cross-sectional view showing a state in which the material substrate is sandwiched between the common mold and the first cooperating mold in the method for producing an optical semiconductor device according to the first embodiment of the present invention.

Then, as shown in FIG. 3, the material substrate 10 is sandwiched between the common mold 70 and the light-transmitting resin mold 71. At this time, the common-side positioning portions 701 of the common mold 70 are caused to extend through the corresponding substrate positioning portions 109 of the material substrate 10, and are fitted into the light-transmitting resin-side positioning portions 711 of the light-transmitting resin mold 71. Note that the substrate positioning portions 109 of the material substrate 10 are sized to allow the material substrate 10 to be appropriately positioned relative to the common mold 70 and the light-transmitting resin mold 71. For example, it is possible to adopt a positional relationship in which the common-side positioning portions 701 are fitted into the substrate positioning portions 109. In this state, the LED chips 2 on the obverse surface 101 are separately accommodated in the body molding portions 713 of the light-transmitting resin mold 71. Each of the body molding portions 713 accommodates two wires 6.

Figure 4:
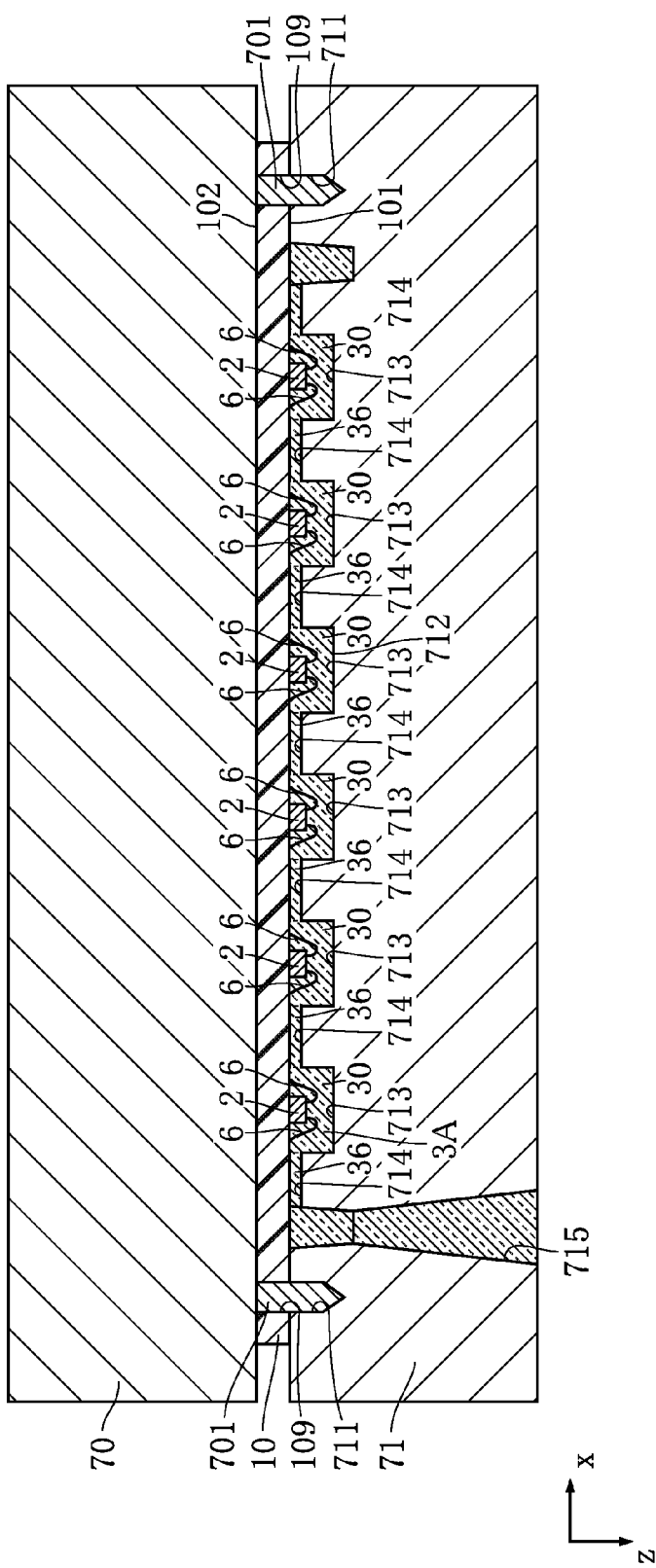
FIG. 4 is a cross-sectional view showing a step of forming a light-transmitting resin in the method for producing an optical semiconductor device according to the first embodiment of the present invention.
Figure 5:
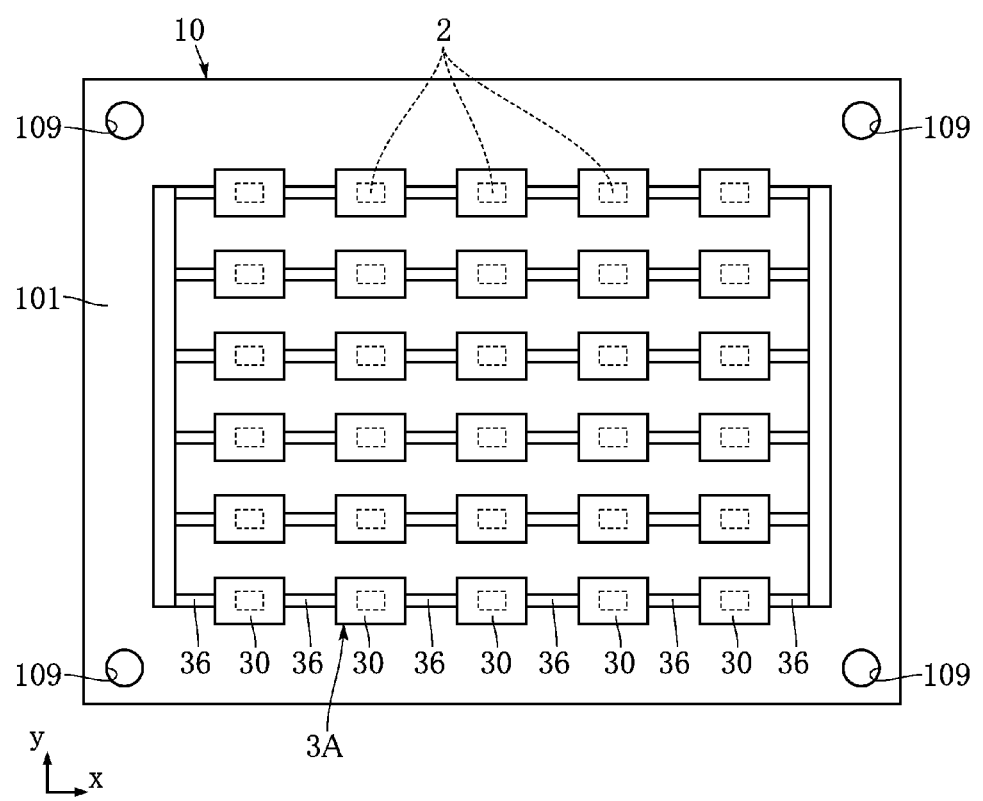
FIG. 5 is a plan view showing a state in which the light-transmitting resin has been formed in the method for producing an optical semiconductor device according to the first embodiment of the present invention.
Figure 6:
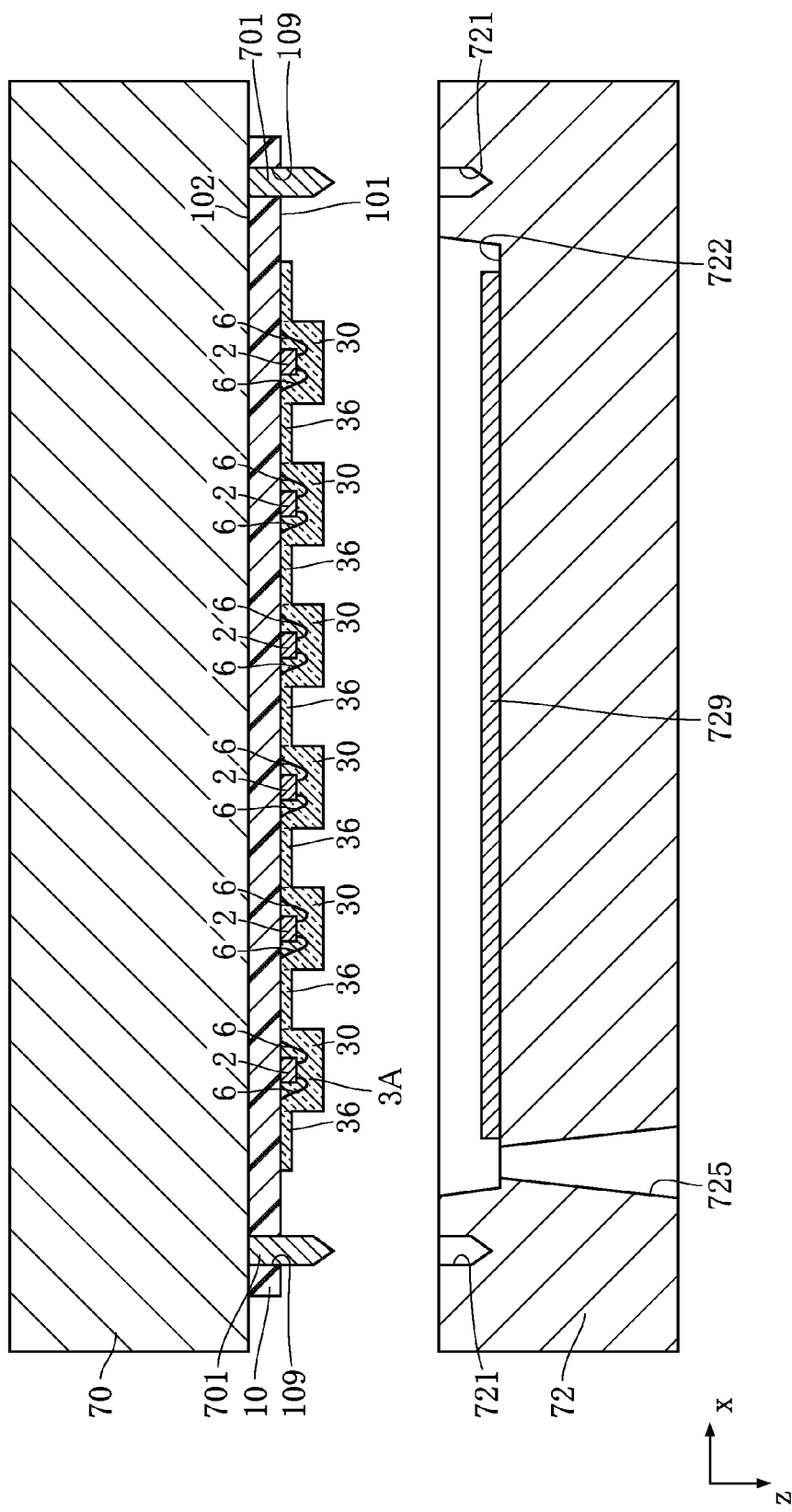
FIG. 6 is a cross-sectional view showing the material substrate, the common mold, and a second cooperating mold (light-shielding resin mold) in the method for producing an optical semiconductor device according to the first embodiment of the present invention.

Then, as shown in FIG. 4, a light-transmitting resin is injected via the injection hole 715 into the light-transmitting resin cavity 712. The light-transmitting resin may be any material capable of transmitting light from the LED chips 2, and may be, for example, an epoxy resin, a silicone resin, or the like. By solidifying the light-transmitting resin, a light-transmitting resin member 3A is formed. The light-transmitting resin member 3A includes a plurality of body portions 30 and a plurality of connecting portions 36. The body portions 30 are portions in which the light-transmitting resin has been solidified in a space surrounded by the body molding portions 713 of the light-transmitting resin mold 71 and the obverse surface 101 of the material substrate 10. Each body portion 30 seals an LED chip 2 and two wires 6. The connecting portions 36 are portions in which the light-transmitting resin has been solidified in a space surrounded by the connection molding portions 714 of the light-transmitting resin mold 71 and the obverse surface 101 of the material substrate 10. FIG. 5 is a plan view showing the material substrate 10 that has undergone the step of forming the light-transmitting resin member 3A. As shown in FIGS. 4 and 5, the body portions 30 are arranged in a matrix configuration along the x-direction and the y-direction. Each of the connecting portions 36 connects the body portions 30 that are adjacent in the x-direction. The cross-sectional area, perpendicular to the x-direction, of each of the connecting portions 36 is smaller than the cross-sectional area, perpendicular to the x-direction, of each of the body portions 30.

Then, the light-transmitting resin mold 71 is removed from the common mold 70 and the material substrate 10. At this time, it is preferable that the common mold 70 remains attached to the material substrate 10. Then, a second cooperating mold 72 for light-shielding resin ("light-shielding resin mold") is disposed on the obverse surface 101 side of the material substrate 10. The light-shielding resin mold 72 includes four light-shielding resin-side positioning portions 721, a cavity 722 for shaping a light-shielding resin ("light-shielding resin cavity"), and an injection hole 725. The light-shielding resin-side positioning portions 721 serve to position the light-shielding resin mold 72 relative to the common mold 70 and the material substrate 10. In the present embodiment, the light-shielding resin-side positioning portions 721 are recessed portions into which the common-side positioning portions 701 of the common mold 70 are fitted, and have the same shape and size as those of the light-transmitting resin-side positioning portions 711 of the light-transmitting resin mold 71. The light-shielding resin cavity 722 can accommodate the entire light-transmitting resin member 3A. In the present embodiment, the spatial shape of the light-shielding resin cavity 722 is defined by providing a spacer 729 in a recessed portion formed in the light-shielding resin mold 72. The spacer 729 is a plate-shaped member made of a metal or a highly heat-resistant resin, for example. The injection hole 725 is a hole for injecting a resin in the subsequent steps, and is in communication with the light-shielding resin cavity 722.

Figure 7:
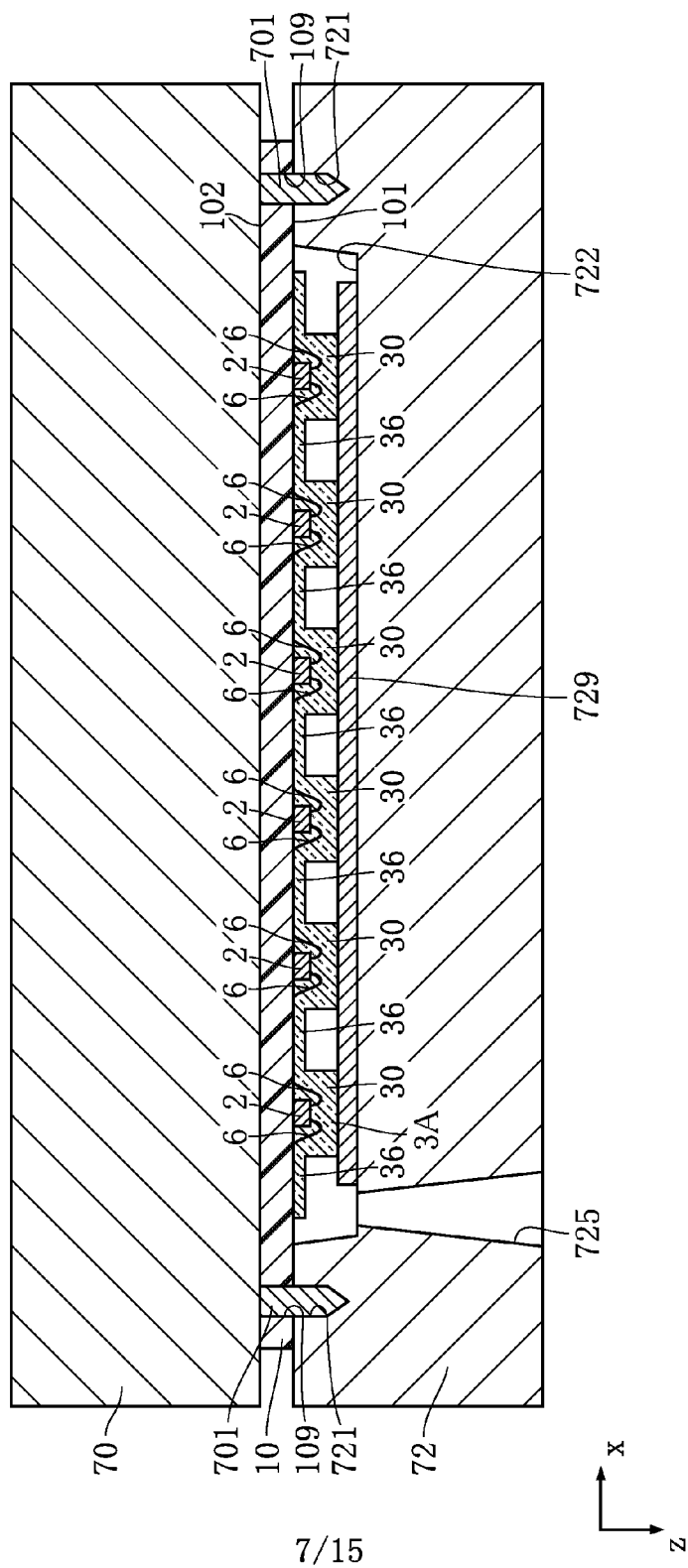
FIG. 7 is a cross-sectional view showing a state in which the material substrate is sandwiched between the common mold and the second cooperating mold in the method for producing an optical semiconductor device according to the first embodiment of the present invention.

Then, as shown in FIG. 7, the material substrate 10 is sandwiched between the common mold 70 and the light-shielding resin mold 72. At this time, the common-side positioning portions 701 of the common mold 70 are fitted into the light-shielding resin-side positioning portions 721 of the light-shielding resin mold 72, while the common-side positioning portions 701 are caused to extend through the substrate positioning portions 109 of the material substrate 10. In this state, the light-transmitting resin member 3A is accommodated in the light-shielding resin cavity 722 of the light-shielding resin mold 72. In addition, the spacer 729 is in contact with the lower surfaces of the body portions 30 in the z-direction.

Figure 8:
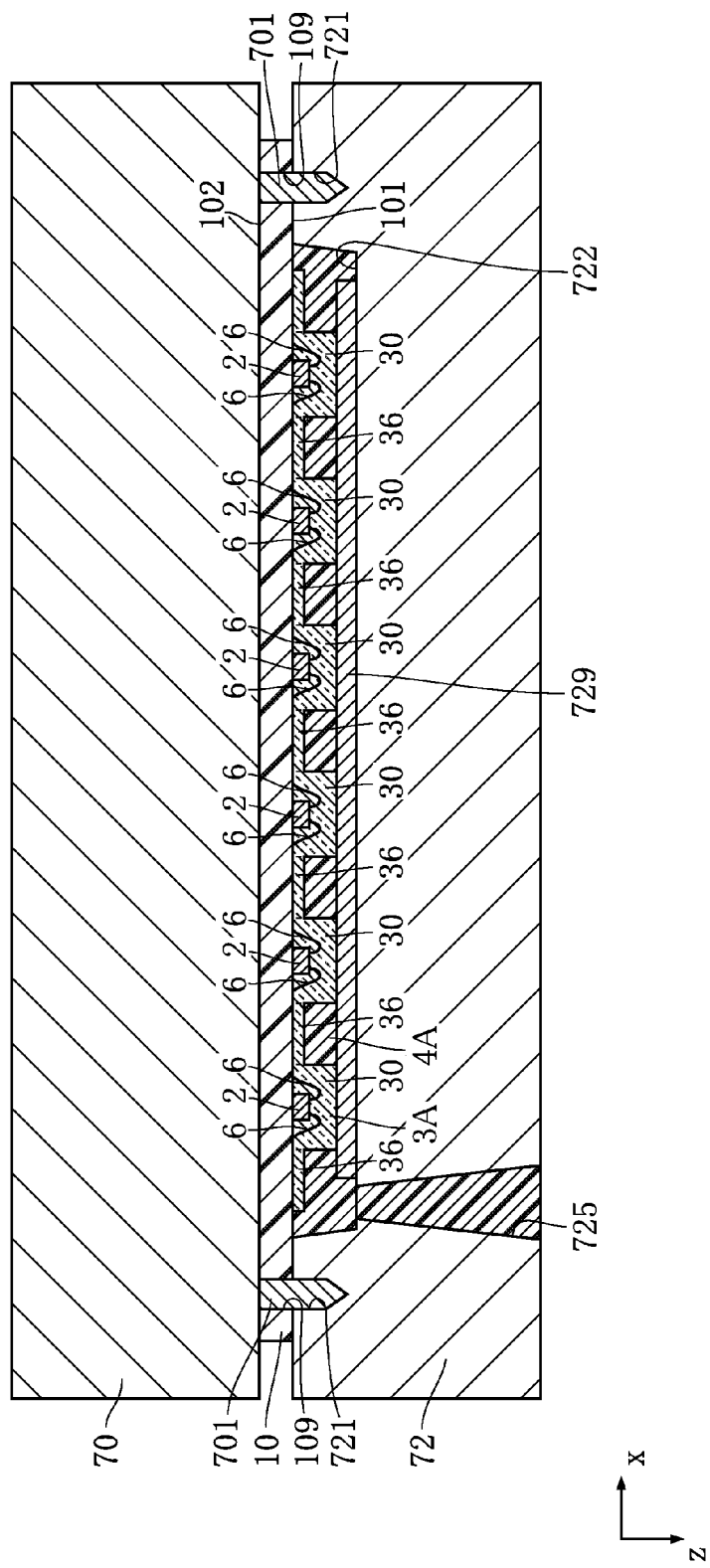
FIG. 8 is a cross-sectional view showing a step of forming a light-shielding resin in the method for producing an optical semiconductor device according to the first embodiment of the present invention.

Then, as shown in FIG. 8, a light-shielding resin is injected via the injection hole 725 into the light-shielding resin cavity 722. The light-shielding resin may be any material capable of shielding light from the LED chips 2, and may be, for example, a white epoxy resin, silicone resin, or the like. By solidifying the light-shielding resin, a light-shielding resin member 4A is formed. The light-shielding resin member 4A is formed so as to fill gaps between the body portions 30. In addition, the light-shielding resin member 4A covers the connecting portions 36. Since the spacer 729 is in contact with the body portions 30, the bottom surfaces of the body portions 30 in the z-direction and the lower surface of the light-shielding resin member 4A in the z-direction are flush with each other.

Figure 9:
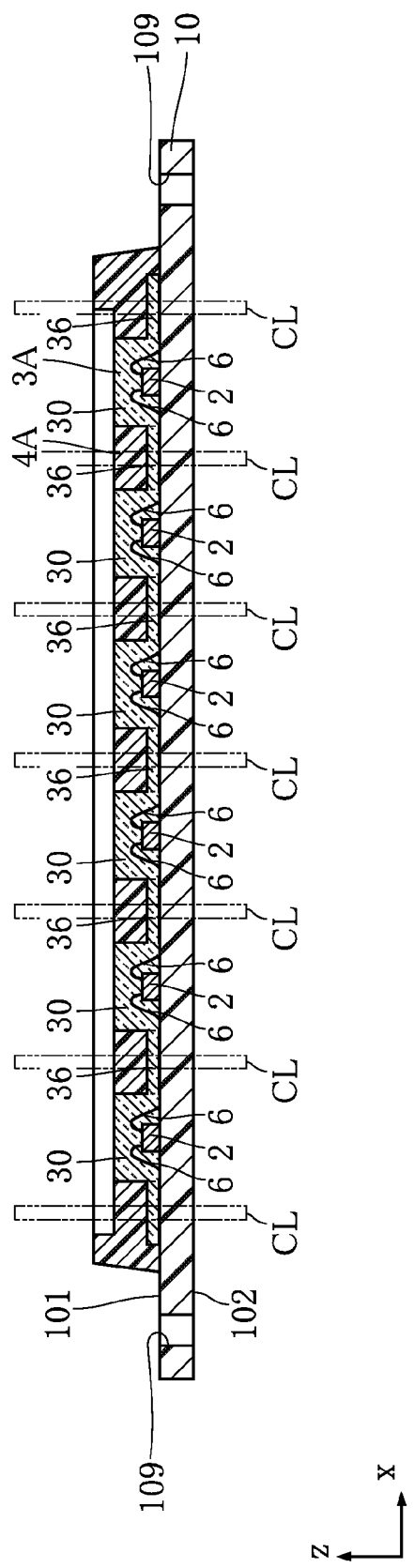
FIG. 9 is a cross-sectional view showing a step of cutting a material substrate in the method for producing an optical semiconductor device according to the first embodiment of the present invention.

Then, as shown in FIG. 9, the common mold 70 and the light-shielding resin mold 72 are removed from the material substrate 10. Then, the material substrate 10, the light-transmitting resin member 3A, and the light-shielding resin member 4A are cut along cutting lines CL. The cutting is performed such that the body portions 30 (LED chips 2) arranged in a matrix configuration are separated from each other. Specifically, each cutting line CL is located between adjacent body portions 30. In the x-direction, the body portions 30 extend across the connecting portions 36. By the cutting step, a plurality of optical semiconductor devices A1 as shown in FIGS. 10 to 15 are obtained.

Figure 10:
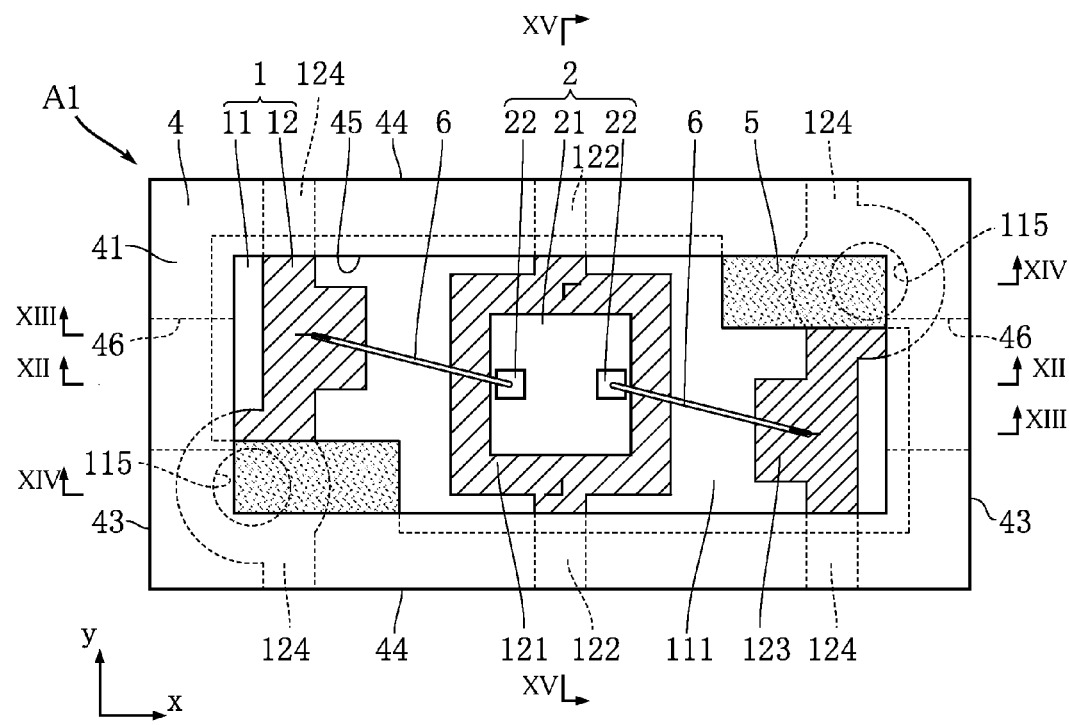
FIG. 10 is a plan view showing relevant portions of an optical semiconductor device according to the first embodiment of the present invention.
Figure 11:
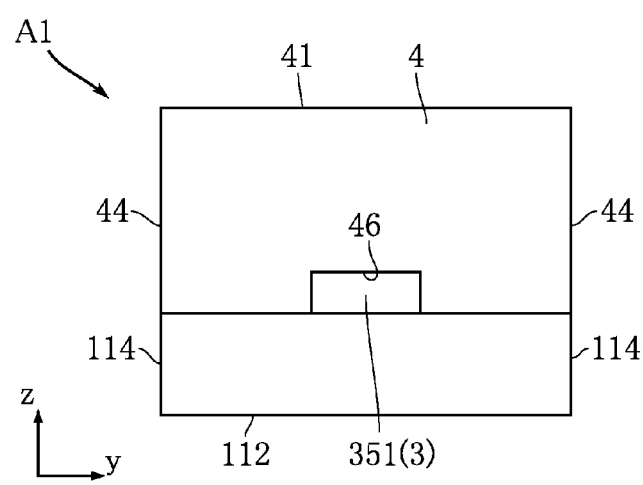
FIG. 11 is a side view showing the optical semiconductor device shown in FIG. 10.
Figure 12:
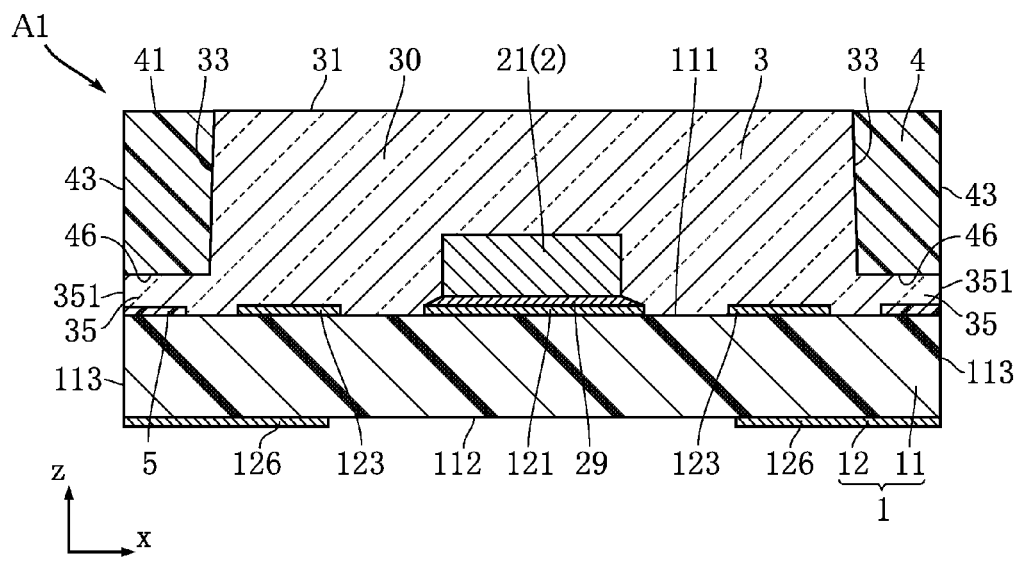
FIG. 12 is a cross-sectional view taken along the line XII-XII in FIG. 10.
Figure 13:
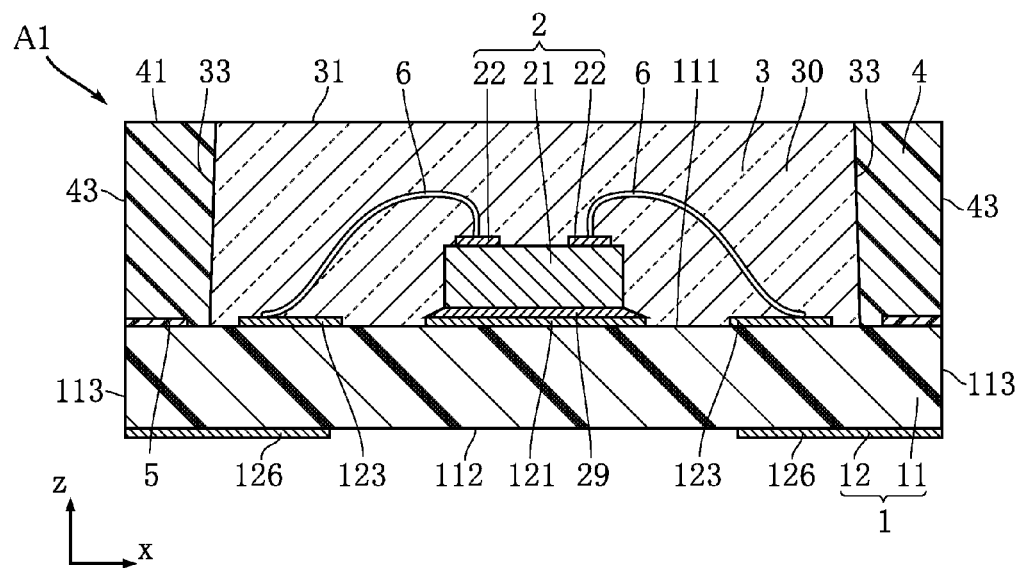
FIG. 13 is a cross-sectional view taken along the line XIII-XIII in FIG. 10.
Figure 14:
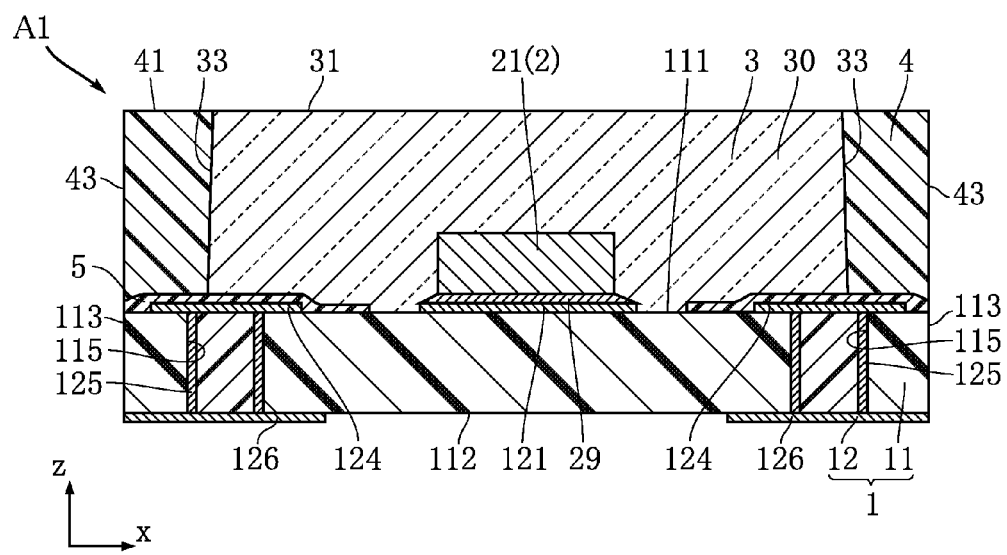
FIG. 14 is a cross-sectional view taken along the line XIV-XIV in FIG. 10.
Figure 15:
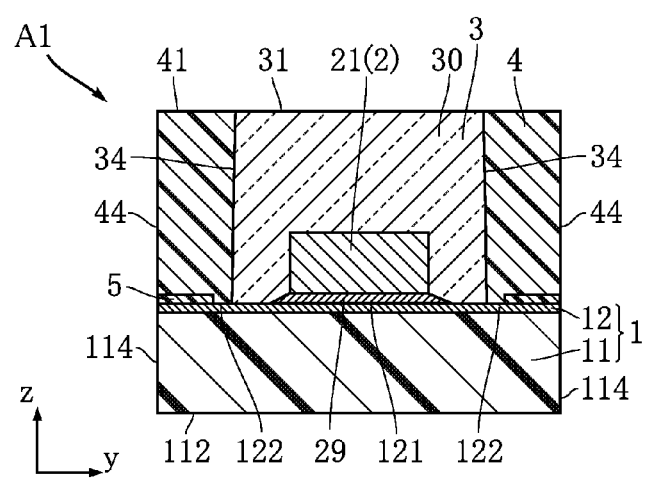
FIG. 15 is a cross-sectional view taken along the line XV-XV in FIG. 10.

Each optical semiconductor device A1 includes a substrate 1, an LED chip 2, a light-transmitting resin 3, a light-shielding resin 4, a resist layer 5, and two wires 6. FIG. 10 is a plan view of relevant portions of the optical semiconductor device A1, from which the light-transmitting resin 3 has been omitted for facilitating the understanding. The exposed portions of a wiring pattern 12 are hatched with diagonal lines, and the exposed portions of the resist layer 5 are hatched with dispersed dots. FIG. 11 is a side view of the optical semiconductor device A1. FIG. 12 is a cross-sectional view taken along the line XII-XII in FIG. 10. FIG. 13 is a cross-sectional view taken along the line XIII-XIII in FIG. 10. FIG. 14 is a cross-sectional view taken along the line XIV-XIV in FIG. 10. FIG. 15 is a cross-sectional view taken along the line XV-XV in FIG. 10.

The substrate 1 includes a base 11 and a wiring pattern 12, and is obtained by cutting the above-described material substrate 10. The base 11 is made of, for example, an insulating material such as an epoxy resin, and includes an obverse surface 111, a reverse surface 112, a pair of base first side surfaces 113, and a pair of base second side surfaces 114. The obverse surface 111 and the reverse surface 112 face opposite to each other in the z-direction. The pair of base first side surfaces 113 are opposite end surfaces of the base 11 in the x-direction. The pair of base second side surfaces 114 are opposite end surfaces of the base 11 in the y-direction. The base 11 has a rectangular shape whose longitudinal direction coincides with the x-direction in plan view (as viewed in the z-direction). The base 11 has a pair of through-holes 115. The pair of through-holes 115 extend through the base 11 in the z-direction. The pair of through-holes 115 are spaced apart from each other in the x-direction. Further, the pair of through-holes 115 are disposed on one side and the other side in the y-direction.

The wiring pattern 12 is a conductive material layer formed on the base 11, and is formed of, for example, a single plated layer or a plurality of plated layers of a metal selected from Cu, Ni, Ti, Au and the like. The wiring pattern 12 includes a die bonding portion 121, a pair of die bonding extending portions 122, a pair of wire bonding portions 123, two pairs of wire bonding extending portions 124, a pair of through-hole portions 125, and a pair of reverse surface electrodes 126.

The die bonding portion 121 is disposed at substantially the center of the obverse surface 101 of the base 11, and is a portion to which the LED chip 2 is bonded. The pair of die bonding extending portions 122 extends in the y-direction from the die bonding portion 121. The die bonding extending portions 122 extend to the corresponding base second side surfaces 114 of the base 11 in plan view.

The pair of wire bonding portions 123 are portions to which the wires 6 are bonded. The pair of wire bonding portions 123 are disposed on opposite sides in the x-direction across the die bonding portion 121. In the present embodiment, the pair of wire bonding portions 123 are disposed so as to be offset to mutually different sides in the y-direction. Note that the arrangement of the pair of through-holes 115 and the arrangement of the pair of wire bonding portions 123 are substantially reversed in the y-direction.

The two pairs of wire bonding extending portions 124 extend in the y-direction from the pair of wire bonding portions 123. More specifically, one pair of wire bonding extending portions 124 extend from a wire bonding portion 123. The wire bonding extending portions 124 extend to the corresponding base second side surfaces 114 in plan view.

The pair of through-hole portions 125 are formed on the inner surfaces of the corresponding through-holes 115 of the base 11. The upper ends of the through-hole portions 125 in the z-direction are connected to the corresponding wire bonding extending portions 124.

The pair of reverse surface electrodes 126 are formed on the reverse surface 112 of the base 11. The pair of reverse surface electrodes 126 are disposed so as to be spaced apart from each other in the x-direction. The lower ends of the through-hole portions 125 in the z-direction are connected to the corresponding reverse surface electrodes 126.

The LED chip 2 is a light source of the optical semiconductor device A1. The LED chip 2 is mounted on the wiring pattern 12 on the obverse surface 111 of the substrate 1. The mounting is performed, for example, by bonding the bottom surface of the LED chip 2 to the die bonding portion 121 of the wiring pattern 12 by using a bonding material 29. In the present embodiment, the bonding material 29 may be either conductive or insulating.

The LED chip 2 includes a body portion 21 and a pair of chip electrodes 22. The body portion 21 is a structure in which a plurality of layers composed mainly of a semiconductor material are stacked. The pair of chip electrodes 22 are electrodes for applying a current to an active layer or the like of the body portion 21.

One end of each of the pair of wires 6 is bonded to the corresponding chip electrode 22 of the LED chip 2, and the other end thereof is bonded to the corresponding wire bonding portion 123 of the wiring pattern 12. Each wire 6 is a metal wire made of Au, for example.

The light-transmitting resin 3 is made of a transparent resin such as an epoxy resin or a silicone resin. Alternatively, the light-transmitting resin 3 may contain a fluorescent material that emits different wavelengths of light when being excited by the light from the LED chip 2. In this case, the light-transmitting resin 3 has a semi-transparent appearance.

The light-transmitting resin 3 includes a body portion 30 and a pair of extending portions 35. The body portion 30 is a portion covering the LED chip 2 and the pair of wires 6, and is substantially rectangular solid-shaped. The body portion 30 includes a light-transmitting resin obverse surface 31, a pair of light-transmitting resin first side surfaces 33, and a pair of light-transmitting resin second side surfaces 34. The light-transmitting resin obverse surface 31 faces upward in the z-direction in the drawings, and faces in the same direction as the obverse surface 101.

The pair of light-transmitting resin first side surfaces 33 are surfaces located at opposite ends of the body portion 30 in the x-direction. The light-transmitting resin first side surfaces 33 are inclined so as to be closer to the LED chip 2 in the x-direction from the substrate 1 toward the direction in which the obverse surface 111 faces.

The pair of light-transmitting resin second side surfaces 34 are surfaces located at opposite ends of the body portion 30 in the y-direction. The light-transmitting resin second side surfaces 34 are inclined so as to be closer to the LED chip 2 in the y-direction from the substrate 1 toward the direction in which the obverse surface 111 faces.

The reason that the pair of light-transmitting resin first side surfaces 33 and the pair of light-transmitting resin second side surfaces 34 are configured as inclined surfaces as described above is that each body molding portion 713 has an inclined inner surface in order to allow the light-transmitting resin mold 71 to be smoothly removed from the light-transmitting resin member 3A after the step of forming the light-transmitting resin member 3A as shown in FIG. 4.

The pair of extending portions 35 extend on opposite sides in the x-direction from the body portion 30. The cross-sectional area, perpendicular to the x-direction, of each of the extending portions 35, is smaller than the cross-sectional area perpendicular to the x-direction, of the body portion 30. The extending portions 35 each include an extending portion end surface 351. In the present embodiment, the extending portion end surfaces 351 extend to the corresponding base first side surfaces 113 of the base 11 in plan view, and are exposed from the light-shielding resin 4.

The light-shielding resin 4 covers the light-transmitting resin 3 so as to surround the light-transmitting resin 3 in plan view, and is made of, for example, a resin such as a white epoxy resin or silicone resin that shields the light from the LED chip 2. The light-shielding resin 4 includes a light-shielding resin obverse surface 41, a pair of light-shielding resin first side surfaces 43, a pair of light-shielding resin second side surfaces 44, an accommodating portion 45, and a pair of through portions 46.

The accommodating portion 45 is a portion that accommodates the body portion 30 of the light-transmitting resin 3. The light-shielding resin obverse surface 41 is a surface facing upward in the z-direction in the drawings, and is flush with the light-transmitting resin obverse surface 31 of the body portion 30 in the present embodiment. This is because the spacer 729 of the light-shielding resin mold 72 was in contact with the body portions 30 of the light-transmitting resin member 3A in the steps shown in FIGS. 7 and 8.

The pair of light-shielding resin first side surfaces 43 are opposite end surfaces of the light-shielding resin 4 in the x-direction. The light-shielding resin first side surfaces 43 are perpendicular to the x-direction. In the present embodiment, the light-shielding resin first side surfaces 43, the extending portion end surfaces 351, and the base first side surfaces 113 are flush with one another.

The pair of light-shielding resin second side surfaces 44 are opposite end surfaces of the light-shielding resin 4 in the y-direction. The light-shielding resin second side surfaces 44 are perpendicular to the y-direction. In the present embodiment, the light-shielding resin second side surfaces 44 and the base second side surfaces 114 are flush with each other.

The pair of through portions 46 are in communication with the accommodating portion 45, and extends in the x-direction. The through portions 46 accommodate the corresponding extending portions 35 of the light-transmitting resin 3.

Next, the advantageous effects of the method for producing the optical semiconductor device A1 and the optical semiconductor device A1 will be described.

According to the present embodiment, after forming a light-transmitting resin member 3A including a plurality of body portions 30 each of which seals an LED chip 2, a light-shielding resin member 4A is formed so as to fill the gaps between the body portions 30. Accordingly, there will be no interference with the light-shielding resin member 4A during bonding of the LED chips 2. This makes it possible to further reduce the distance between the light-shielding resin 4 and the LED chips 2. Therefore, it is possible to appropriately produce an optical semiconductor device A1, while reducing the size of the optical semiconductor device A1.

Each body portion 30 seals a pair of wires 6. Accordingly, the interference between the capillary for bonding the wires 6 and the light-shielding resin member 4A cannot occur. This is desirable for the size reduction of the optical semiconductor device A1.

The cross-sectional area of each of the connecting portions 36 is smaller than that of each of the body portions 30. Accordingly, in a state in which the light-transmitting resin member 3A has been formed on the material substrate 10, the obverse surface 101 of the material substrate 10 is not entirely covered with a light-transmitting resin member 3A having a uniform thickness. There is concern that the more uniform the thickness of the light-transmitting resin member 3A, the more likely the material substrate 10 is warped. In the present embodiment, the body portions 30 are disposed so as to be spaced apart from each other, and are merely connected by the connecting portions 36 that are relatively small portions. Therefore, the warpage of the material substrate 10 can be suppressed. Accordingly, the thickness of the material substrate 10 can be reduced, making it possible to reduce the dimension of the optical semiconductor device A1 in the z-direction.

The common mold 70 and the material substrate 10 are positioned relative to each other by using the common-side positioning portions 701 of the common mold 70 and the substrate positioning portions 109 of the material substrate 10, and the common mold 70 and the material substrate 10 are positioned relative to the light-transmitting resin mold 71 by using the light-transmitting resin-side positioning portions 711 of the light-transmitting resin mold 71 and the common-side positioning portions 701. Further, the common mold 70 and the material substrate 10 are positioned relative to the light-shielding resin mold 72 by using the light-shielding resin-side positioning portions 721 of the light-shielding resin mold 72 and the common-side positioning portions 701. By following this procedure, the light-transmitting resin member 3A formed by using the light-transmitting resin mold 71 and the light-shielding resin cavity 722 of the light-shielding resin mold 72 can be set to more accurate positions. This is desirable for the formation of a smaller optical semiconductor device A1.

By dividing the connecting portions 36 during cutting of the material substrate 10, the extending portions 35 are formed. By using this method, the extending portion end surfaces 351 are exposed from the light-shielding resin 4 in the optical semiconductor device A1, but the extending portion end surfaces 351 are surfaces that are sufficiently spaced apart from the LED chip 2 in the x-direction and are relatively small. Accordingly, light leakage from the extending portion end surfaces 351 poses substantially no problem. At the same time, there is no need to perform the step for sealing the extending portion end surfaces 351 with the light-shielding resin 4, so that the production efficiency of the optical semiconductor device A1 can be increased.

Figure 16:
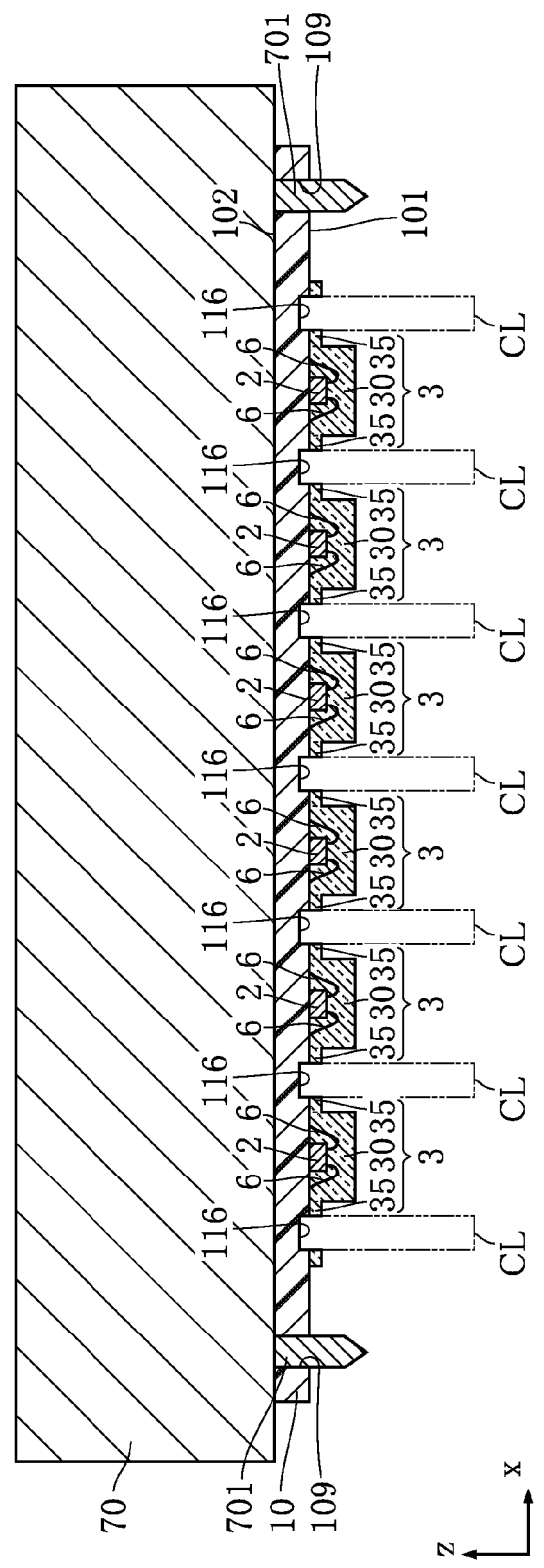
FIG. 16 is a cross-sectional view showing a step of dividing connecting portions in a method for producing an optical semiconductor device according to a second embodiment of the present invention.
Figure 17:
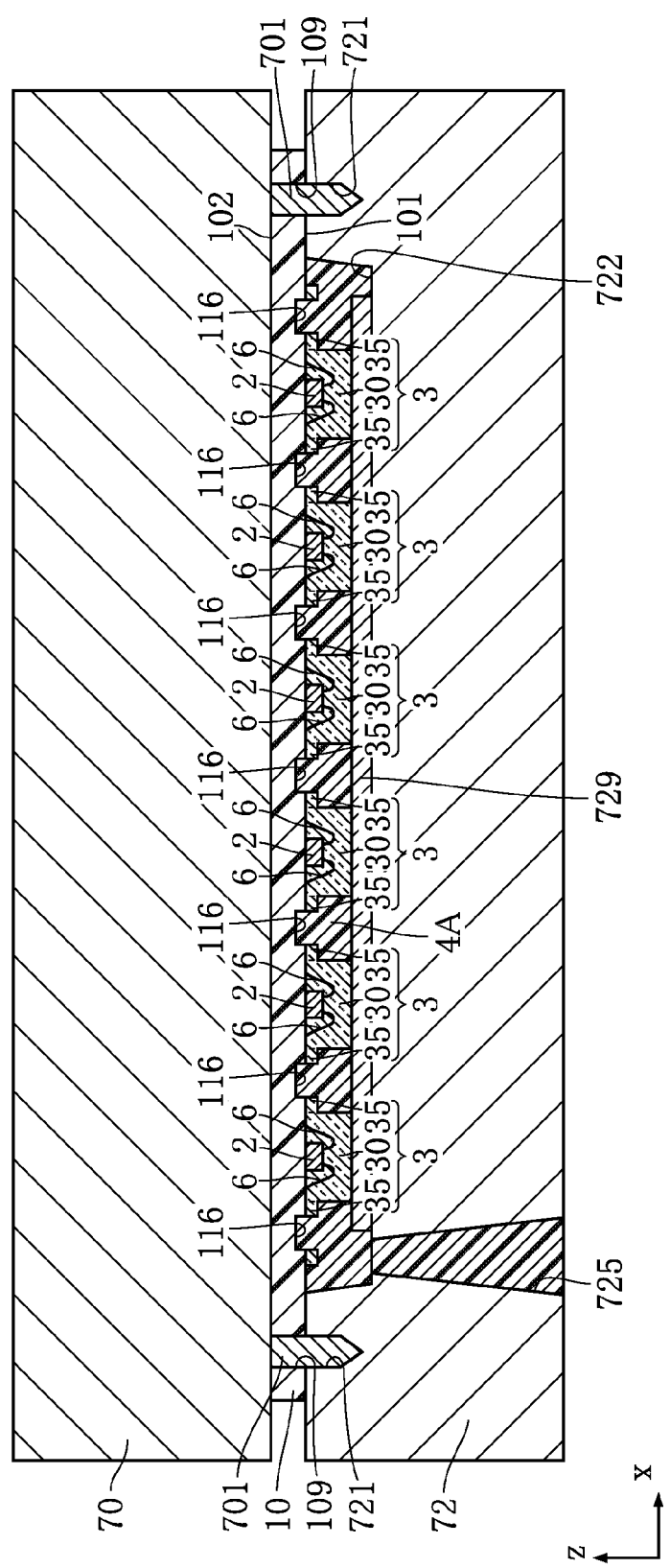
FIG. 17 is a cross-sectional view showing a step of forming a light-shielding resin in the method for producing an optical semiconductor device according to the second embodiment of the present invention.
Figure 18:
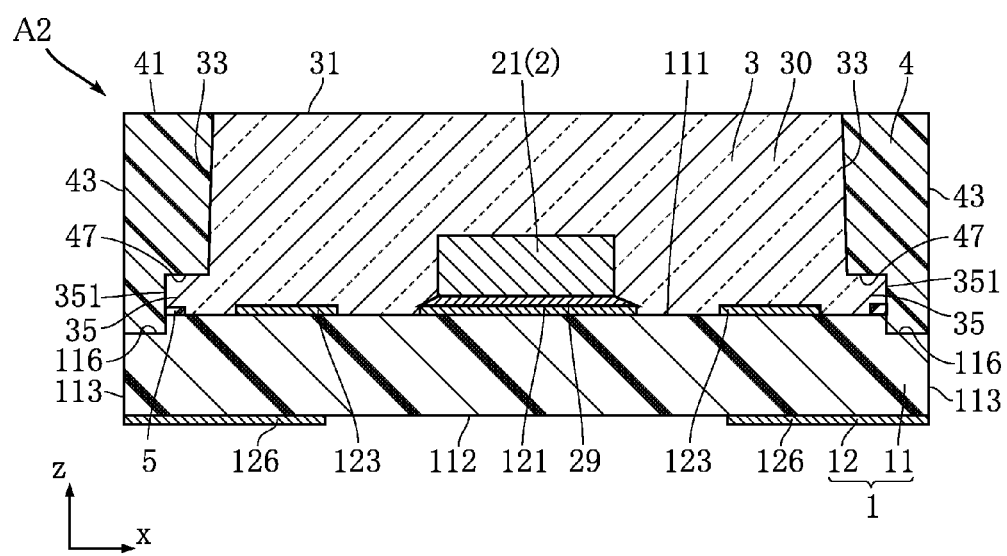
FIG. 18 is a cross-sectional view showing an optical semiconductor device according to the second embodiment of the present invention.

FIGS. 16 to 18 show another embodiment of the present invention. Note that elements that are the same as or similar to the elements in the above-described embodiment are denoted by the same reference numeral in these diagrams.

FIGS. 16 and 17 show a method for producing an optical semiconductor device according to a second embodiment of the present invention. In FIG. 16, the material substrate 10 shown in FIG. 6 that has undergone the step of forming the light-transmitting resin member 3A shown in FIGS. 4 and 5 is used. In the present embodiment, a light-transmitting resin member 3A formed on the material substrate 10 is subjected to cutting or the like, whereby a plurality of connecting portions 36 are divided in the x-direction. Consequently, extending portions 35 connected to opposite sides of each body portion 30 in the x-direction are formed. In the present embodiment, a part of the material substrate 10 that is located on the obverse surface 101 side is removed at the time of dividing the connecting portions 36. Consequently, a plurality of groove portions 116 are formed on the material substrate 10. Each groove portion 116 extends in the y-direction between the body portions 30 that are adjacent in the x-direction.

Then, as shown in FIG. 17, a light-shielding resin member 4A is formed by using a light-shielding resin mold 72. Then, the material substrate 10 is cut by a step similar to the step shown in FIG. 9. During the cutting, the material substrate 10 is cut at positions between the extending portions 35 that are adjacent in the x-direction. Consequently, a plurality of optical semiconductor devices A2 as shown in FIG. 18 are obtained.

In each optical semiconductor device A2, the extending portion end surfaces 351 of the pair of extending portions 35 of the light-transmitting resin 3 are covered with the light-shielding resin 4, and are retracted inward in the x-direction from the corresponding base first side surface 113 of the base 11 in plan view. The light-shielding resin 4 includes a pair of recessed portions 47. Each of the pair of recessed portions 47 accommodates the corresponding extending portion 35 of the light-transmitting resin 3. A pair of groove portions 116 are formed on the base 11 of the substrate 1. The groove portions 116 are filled with the light-shielding resin 4.

With this embodiment as well, it is possible to appropriately produce the optical semiconductor device A2, while reducing the size of the optical semiconductor device A2. According to the present embodiment, it is possible to achieve a configuration in which the light-transmitting resin 3 is not exposed from the light-shielding resin 4 in the x-direction.

The method for producing an optical semiconductor device and the optical semiconductor device of the invention are not limited to the above embodiments. Various design modifications can be made for the specific configuration of the method and the device.

The invention claimed is:

1. An optical semiconductor device comprising:
   a substrate including a base and a wiring pattern, the base including a base obverse surface and a base reverse surface spaced apart from each other in a thickness direction;
   an LED chip mounted on the base obverse surface;
   a light-transmitting resin member covering the LED chip; and
   a light-shielding resin member covering a part of the light-transmitting resin member,
   wherein the light-transmitting resin member includes a body portion covering the LED chip, and an extending portion extending from the body portion in a first direction perpendicular to the thickness direction,
   the light-shielding resin member covers at least a part of the extending portion,
   the extending portion has an extending portion end surface facing in the first direction, and
   the light-shielding resin member is formed with a recessed portion that accommodates the extending portion end surface.

2. The optical semiconductor device according to claim 1, wherein the extending portion has a first cross section perpendicular to the first direction, the body portion has a second cross section perpendicular to the first direction, and the first cross section is smaller in area than the second cross section.

3. The optical semiconductor device according to claim 1, further comprising a wire for connecting the LED chip to the wiring pattern.

4. The optical semiconductor device according to claim 3, wherein the wire is covered by the body portion.

5. The optical semiconductor device according to claim 1, wherein the extending portion end surface is exposed from the light-shielding resin member.

6. The optical semiconductor device according to claim 1, wherein the light-shielding resin member includes a side surface that faces in the first direction and is flush with the extending portion end surface.

7. The optical semiconductor device according to claim 1 wherein the extending portion end surface is covered with the light-shielding resin member.

8. The optical semiconductor device according to claim 1, wherein the body portion includes a body portion obverse surface that faces in a same direction as the base obverse surface and is exposed from the light-shielding resin member.

9. The optical semiconductor device according to claim 8, wherein the light-shielding resin member includes an accommodating portion that accommodates the body portion, and a light-shielding resin obverse surface facing in a same direction as the base obverse surface.

10. The optical semiconductor device according to claim 9, wherein the light-shielding resin obverse surface is flush with the body portion obverse surface.

11. The optical semiconductor device according to claim 1, wherein the wiring pattern includes a die bonding portion to which the LED chip is bonded.

12. The optical semiconductor device according to claim 11, wherein the wiring pattern includes a die bonding extending portion extending from the die bonding portion in a second direction perpendicular to both the thickness direction and the first direction.

13. The optical semiconductor device according to claim 12, wherein the base includes a side surface facing in the second direction, and the die bonding extending portion extends up to the side surface of the base in plan view.

14. The optical semiconductor device according to claim 3, wherein the wiring pattern includes a wire bonding portion to which the wire is bonded.

15. The optical semiconductor device according to claim 14, wherein the wiring pattern includes a wire bonding extending portion extending from the wire bonding portion in a second direction perpendicular to both the thickness direction and the first direction.

16. The optical semiconductor device according to claim 15, wherein the base includes a side surface facing in the second direction, and the wire bonding extending portion extends up to the side surface of the base in plan view.

17. The optical semiconductor device according to claim 14, wherein the base is formed with a through-hole extending through the base in the thickness direction, the through-hole being disposed alongside the wire bonding portion as viewed in a second direction perpendicular to both the thickness direction and the first direction, and
the wiring pattern includes a through-hole portion formed on an inner surface of the through-hole.

18. The optical semiconductor device according to claim 17, wherein the wiring pattern includes a reverse surface electrode formed on the base reverse surface and connected to the through-hole portion.

19. An optical semiconductor device comprising:
a substrate including a base and a wiring pattern, the base including a base obverse surface and a base reverse surface spaced apart from each other in a thickness direction;
an LED chip mounted on the base obverse surface;
a light-transmitting resin member covering the LED chip; and
a light-shielding resin member covering a part of the light-transmitting resin member,
wherein the light-transmitting resin member includes a body portion covering the LED chip, and an extending portion extending from the body portion in a first direction perpendicular to the thickness direction,
the light-shielding resin member covers at least a part of the extending portion, and
the light-shielding resin member includes a through portion that accommodates the extending portion.

20. An optical semiconductor device comprising:
a substrate including a base and a wiring pattern, the base including a base obverse surface and a base reverse surface spaced apart from each other in a thickness direction;
an LED chip mounted on the base obverse surface;
a light-transmitting resin member covering the LED chip; and
a light-shielding resin member covering a part of the light-transmitting resin member,
wherein the light-transmitting resin member includes a body portion covering the LED chip, and an extending portion extending from the body portion in a first direction perpendicular to the thickness direction,
the light-shielding resin member covers at least a part of the extending portion,
the extending portion has an extending portion end surface facing in the first direction, and
the base includes a side surface that faces in the first direction and is flush with the extending portion end surface.

21. An optical semiconductor device comprising:
a substrate including a base and a wiring pattern, the base including a base obverse surface and a base reverse surface spaced apart from each other in a thickness direction;
an LED chip mounted on the base obverse surface;
a light-transmitting resin member covering the LED chip; and
a light-shielding resin member covering a part of the light-transmitting resin member,
wherein the light-transmitting resin member includes a body portion covering the LED chip, and an extending portion extending from the body portion in a first direction perpendicular to the thickness direction,
the light-shielding resin member covers at least a part of the extending portion,
the extending portion has an extending portion end surface facing in the first direction,
the light-shielding resin member includes a side surface that faces in the first direction and is flush with the extending portion end surface, and
the base includes a side surface that faces in the first direction and is flush with the side surface of the light-shielding resin member.

22. An optical semiconductor device comprising:
a substrate including a base and a wiring pattern, the base including a base obverse surface and a base reverse surface spaced apart from each other in a thickness direction;
an LED chip mounted on the base obverse surface;
a light-transmitting resin member covering the LED chip; and
a light-shielding resin member covering a part of the light-transmitting resin member,
wherein the light-transmitting resin member includes a body portion covering the LED chip, and an extending portion extending from the body portion in a first direction perpendicular to the thickness direction,
the light-shielding resin member covers at least a part of the extending portion,
the body portion includes a pair of first side surfaces spaced apart from each other in the first direction, and
the pair of first side surfaces are so inclined as to become closer to each other with increasing distance from the base obverse surface.

23. The optical semiconductor device according to claim 22, wherein the body portion includes a pair of second side surfaces spaced apart from each other in a second direction perpendicular to both the thickness direction and the first direction, and
the pair of second side surfaces are so inclined as to become closer to each other with increasing distance from the base obverse surface.

* * * * *